United States Patent [19]

Yoshida

[11] Patent Number: 5,157,476
[45] Date of Patent: Oct. 20, 1992

[54] TAPE CARRIER HAVING IMPROVED TEST PADS

[75] Inventor: Akito Yoshida, Chigasaki, Japan

[73] Assignee: Kabushiki Kaisha Toshiba, Kawasaki, Japan

[21] Appl. No.: 665,303

[22] Filed: Mar. 6, 1991

[30] Foreign Application Priority Data

Mar. 12, 1990 [JP] Japan .................................. 2-57916

[51] Int. Cl.⁵ .......................................... H01L 23/48
[52] U.S. Cl. ....................................... 357/70; 357/68; 357/65; 357/80
[58] Field of Search .......................... 357/70, 65, 68, 80

[56] References Cited

U.S. PATENT DOCUMENTS

| 4,411,719 | 10/1983 | Lindberg et al. | 357/70 |
| 4,575,747 | 3/1986 | Fritz | 357/70 |
| 4,772,936 | 9/1988 | Reding et al. | 357/70 |
| 4,806,409 | 2/1989 | Walter et al. | 357/70 |

Primary Examiner—Andrew J. James
Assistant Examiner—Viet Q. Nguyen
Attorney, Agent, or Firm—Finnegan, Henderson, Farabow, Garrett and Dunner

[57] ABSTRACT

A tape carrier body is provided with a mounting portion on which a semiconductor integrated circuit is mounted and a plurality of test pads which are disposed away from the mounting portion. The semiconductor integrated circuit is provided with a power supply pad to which a supply voltage is applied and a plurality of signal pads for inputting and outputting signals, the number of the test pads being larger than the total number of the power supply pad and the signal pads. The signal pads of the semiconductor integrated circuit and the test pads of the tape carrier body are connected by outer leads. The power supply pad of the semiconductor integrated circuit and outside test pad of the test pads of the tape carrier body are connected by an outer lead.

10 Claims, 6 Drawing Sheets

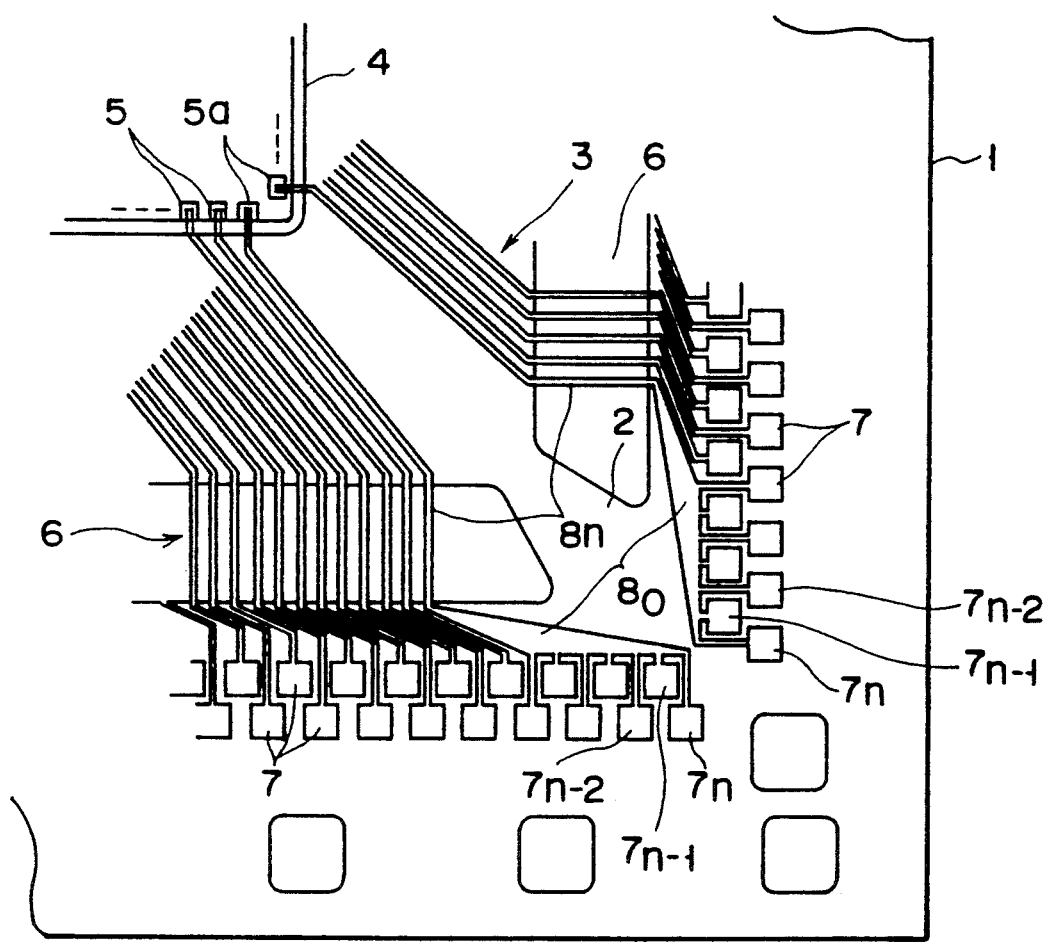
F I G. 2

TAPE CARRIER HAVING IMPROVED TEST PADS

BACKGROUND OF THE INVENTION

1. Field of the Invention

The present invention relates to a tape carrier which is a type of semiconductor package.

2. Description of the Related Art

Heretofore, tape carriers have been used as packages for custom integrated circuits for use in electronic devices such as liquid crystal drivers, electronic watches, hand-held calculators, etc. The tape carriers can be manufactured at fine pitch. For this reason the tape carriers have recently found application in packages for semicustom integrated circuits such as gate arrays.

FIGS. 4 and 5 illustrate prior tape carriers for gate arrays. There is provided a mounting portion 3 in the center of a tape carrier body 1 through tie bars 2. A semiconductor device 4 formed of a gate array is mounted on the center of the mounting portion 3. There are provided pads 5 for inputting and outputting signals and pads 5a for power supply on the periphery of the device 4.

On the tape carrier body 1 there are disposed a number of test pads 7 around slits 6 each formed between the tie bars 2. These test pads 7 are connected to corresponding pads 5 of the device 4 by outer leads 8 extending across the slits 6.

With the tape carrier, various tests including burn-in test are made by the use of the test pads 7 and a socket (not shown) with needles which are brought into contact with corresponding pads 7. If, therefore, the positions of the test pads 7 are determined beforehand, tests for various types of products will be made by the use of a single type of socket. This eliminates the necessity that various types of sockets be developed. For this reason tape carriers of this configuration are suitable for gate arrays whose development time is required to be as short as possible.

FIG. 6 illustrates a tape carrier having more outer leads 8 than the tape carrier shown in FIGS. 4 and 5. This tape carrier is provided with test pads 7 in the same positions as in the tape carrier shown in FIG. 4 and thus permitted to use the same socket as the tape carrier of FIG. 4.

It is usual that the connection of the outer leads 8 to the test pads 7 is made sequentially from the central test pad to its outer test pads and test pads at the ends are left unused. This is to prevent manufacture of the tapes from becoming difficult. According to this approach, the pitch of wires 8a connecting the outer leads 8 to the test pads 7 can be maximized, which makes the manufacture of tapes easy.

With the above-mentioned conventional method of connecting outer leads to test pads, however, some problems may arise in making the burn-in test or other tests although a test socket can be shared among various types of tape carriers. That is, it is difficult to share a burn-in board or a test board among various types of devices because the position of test pads for power supply is device-dependent. Moreover, it is impossible to thicken wires 8a because the spacing between adjacent outer leads is narrow. If the wires are thin, their inductance will increase and thus power noise will be generated. In particular, this is a serious problem in high-speed gate arrays.

SUMMARY OF THE INVENTION

It is an object of the present invention to provide a tape carrier which permits the position of test pads for power supply to be device-independent, the inductance of wires in a package to be decreased and the generation of noise to be prevented.

According to the present invention there is provided a tape carrier comprising:

a tape carrier body having a mounting portion on which a semiconductor integrated circuit is mounted and a plurality of test pads which are disposed away from said mounting portion and to which said semiconductor integrated circuit is connected, said semiconductor integrated circuit being provided with a power supply pad to which a supply voltage is applied and a plurality of signal pads for inputting and outputting signals and the number of said test pads of said tape carrier body being larger than the total number of said power supply pad and said signal pads of said semiconductor integrated circuit;

first leads having their first ends connected to said signal pads of said semiconductor integrated circuit and their second ends connected to said test pads of said tape carrier body; and a second lead having its first end connected to said power supply pad of said semiconductor integrated circuit and its second end connected to an outside test pad of said test pads of said tape carrier body.

According to the present invention, by using the outermost test pad of the test pads of the tape carrier body as a test pad connected to a power supply for the semiconductor integrated circuit, the position of a test pad connected to the power supply pad can be made common to different types of products. Moreover, the inductance of a package itself can be reduced.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 2 and 3 are plan views of principal parts of tape carriers according to embodiments of the present invention;

DETAILED DESCRIPTION OF THE PREFERRED EMBODIMENTS

Figure 4:
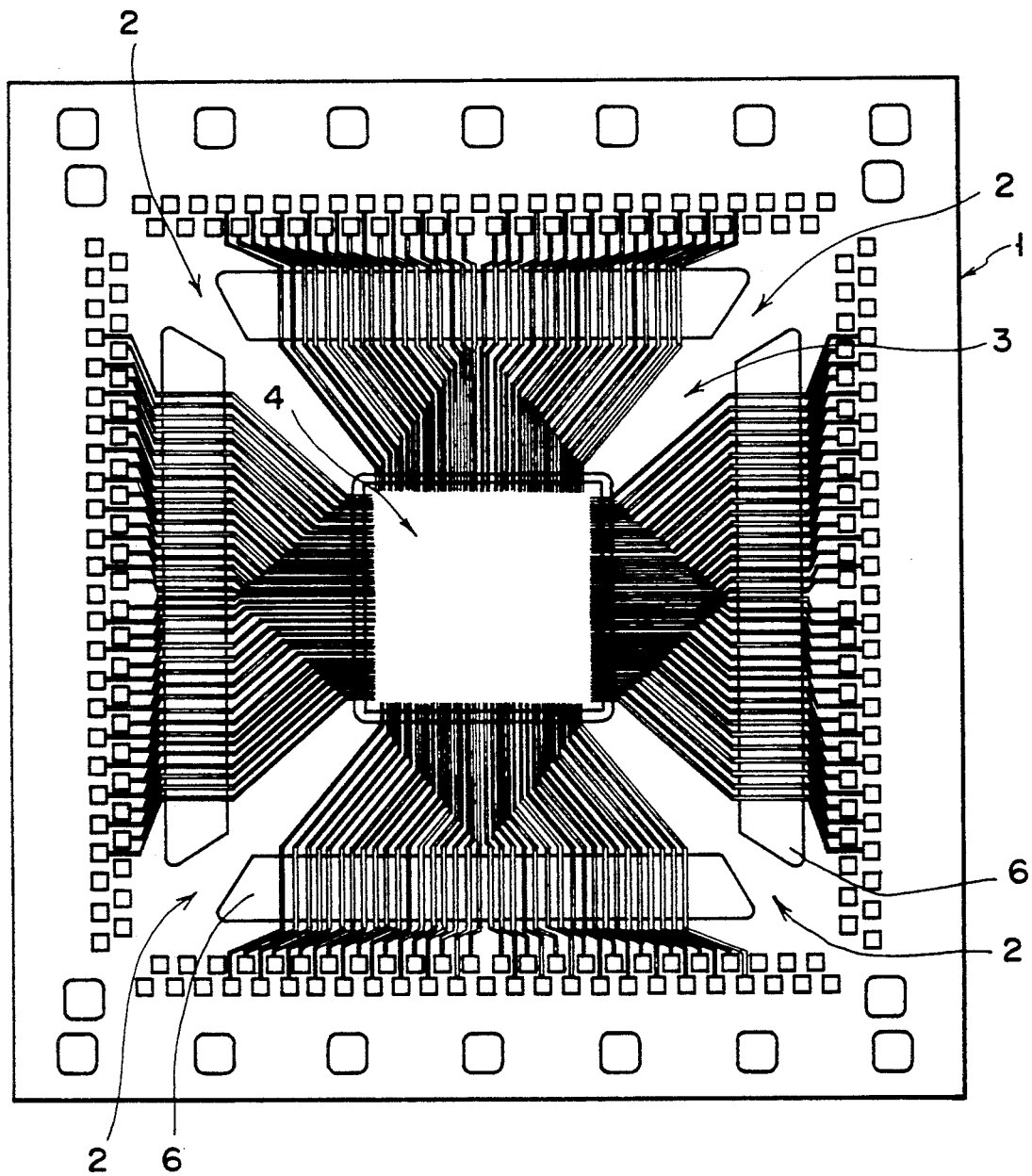
FIG. 4 is a plan view of a prior tape carrier.
Figure 5:
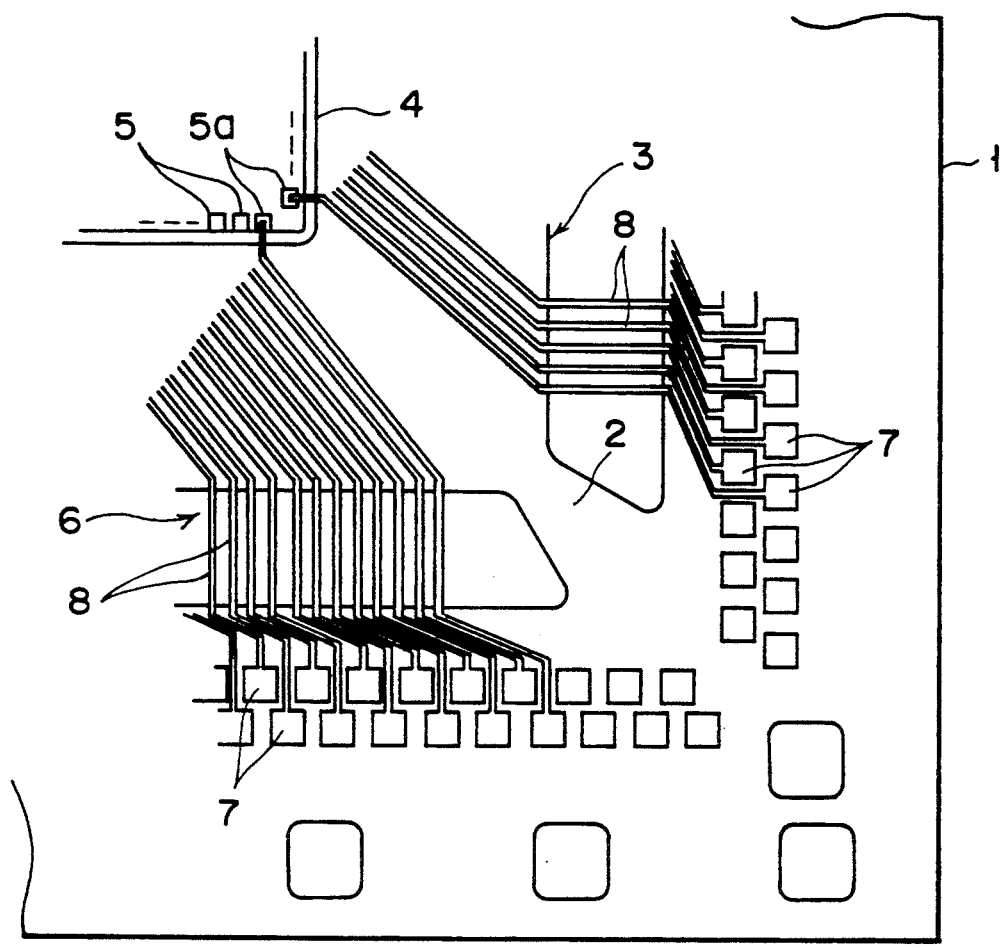
FIG. 5 is plan view of the principal part of the tape carrier of FIG. 4.
Figure 6:
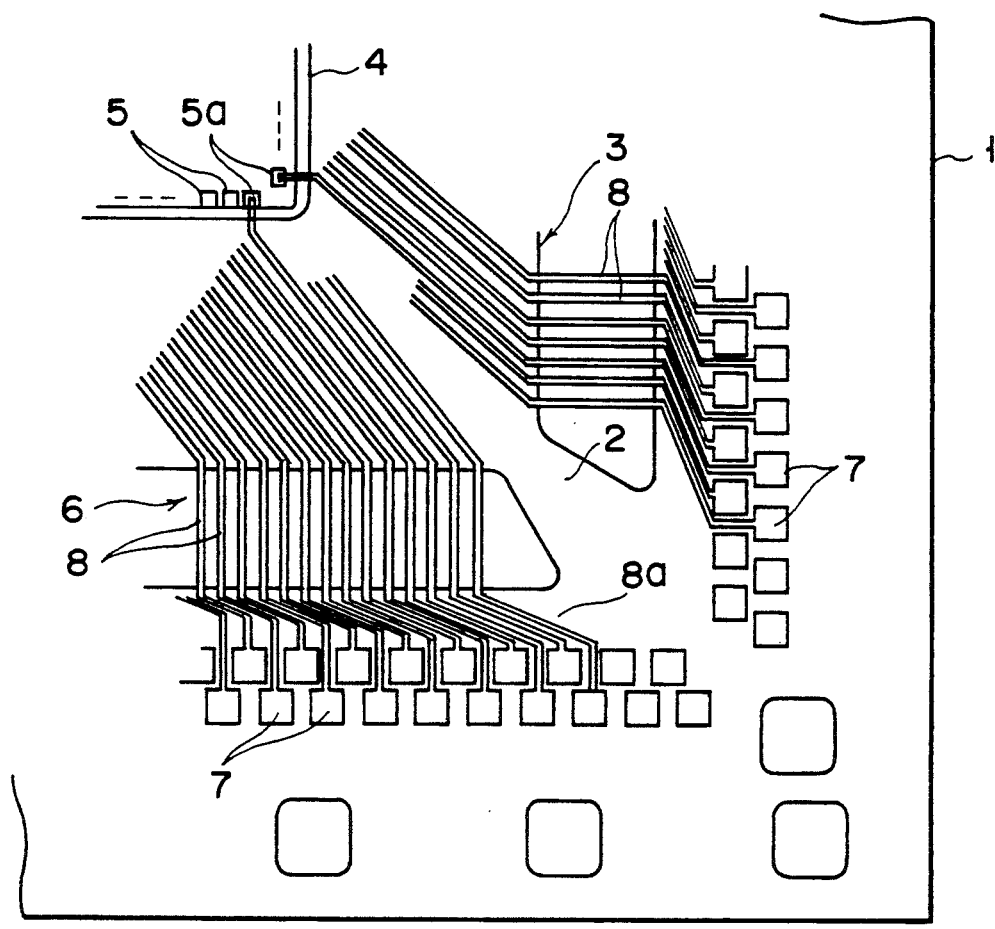
FIG. 6 is a plan view of the other prior tape carrier.

Hereinafter the preferred embodiments of the present invention will be described with reference to FIGS. 1, 2 and 3 in which like reference characters are used to denote corresponding parts to those in FIGS. 4 to 6.

Figure 1:
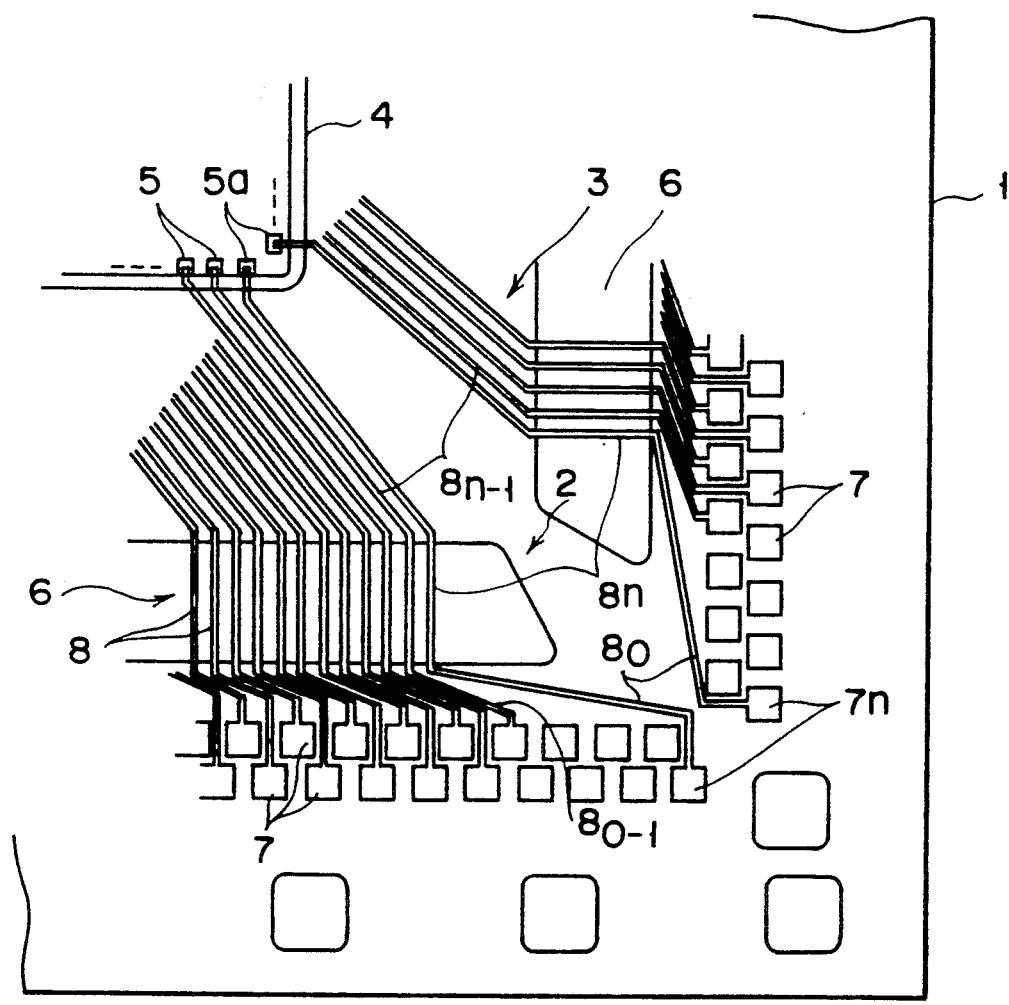

FIG. 1 illustrates a first embodiment of the present invention. In this embodiment, the outermost outer lead 8n is connected to the outermost test pad 7n which is unused in the prior art. The outer lead 8n, which is laid across the slit 6, has its end connected to the power supply pad 5a and its other end connected to the test pad 7n.

The number of the test pads 7n is greater than the sum of the number of the power supply pads 5a and the number of signal-inputting/outputting pads 5 of the device 4. This is because the semiconductor device 4 has no dummy pads at all. If the device 4 had dummy pads which are connected to no components, the number of the pads, i.e., the pads 5a, the pads 5, and the dummy pads, may be greater than the number of the test pads 7n.

According to the first embodiment, the outer leads 8n connected to the power supply pads 5a of the device 4 are connected to the outermost test pads 7n. Thus, the position of the test pads for power supply can be made common to different types of devices.

Moreover, that portion 8o of the outer lead 8n connected to the power supply pad 5a which extends from the slit 6 to the test pad 7n is away from the corresponding portion 8o-1 of the adjacent outer lead 8n-1. Therefore, the portion 8o can be made wide, which permits its inductance to, be reduced and thus prevents the generation of power noise.

FIG. 2 illustrates a second embodiment of the present invention, in which like reference characters are used to denote corresponding parts to those in FIG. 1.

In the second embodiment, that portion 8o of the outer lead 8n connected to the power supply pad 5a which extends between the slit 6 and the test pad 7n is widened gradually from the slit 6 to the test pad 7n for connection to unused test pads 7n, 7n-1, 7n-2, etc.

In the second embodiment as well, the positions of the test pads connected to the power supply pads 5a of the device can be made common to different types of devices. Moreover, that portion 8o of the outer lead 8n connected to the power supply pad 5a which extends from the slit 6 to the test pad 7n is made larger in area than that in the first embodiment and connected to a plurality of test pads. Therefore, the inductance of the portion 8o of the outer lead 8n and the socket can be reduced, so that the generation of power noise is prevented.

Figure 3:
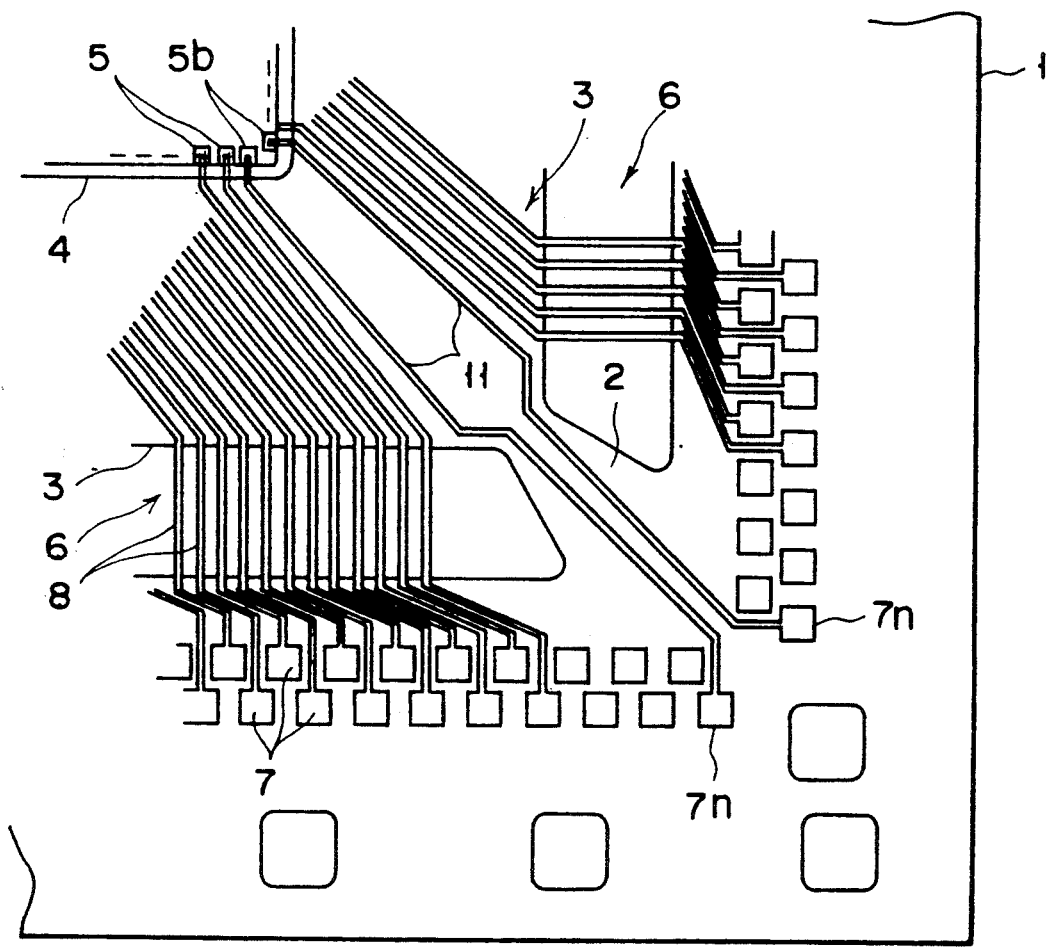

FIG. 3 illustrates third embodiment of the present invention which is a modification of the first embodiment.

In this embodiment, the device 4 is provided with test power supply pads 5b to each of which is connected an exclusive connection lead 11 which is not an outer lead. The connection lead 11 is provided on, for example, the tie bar 2 and has its other end connected to the outermost unused test pad 7n. The test power supply pads 5b are connected to actual power supply pads not shown within the device 4.

The third embodiment can also obtain the same advantages as the first and second embodiments. Moreover, because there is no necessity that the outermost outer lead 8n be used for power supply only, users can use the outermost outer lead as a usual signal line.

While, in the third embodiment, the connection lead 11 is provided on the tie bar 2, it may be provided on any portion that is cut off finally. In addition, while the connection lead 11 is connected to the outermost test pad 7n, it may be connected to a plurality of test pads as in the second embodiment.

Furthermore, in the first and second embodiments, if that part of the outermost outer lead 8n at which connection is made to the device 4 is made wide, the power supply line inductance of the test pad itself will be reduced. In addition, while, in the first and second embodiments, an outer lead is connected to the outermost test pad 7n, it may be connected to an inside test pad.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A tape carrier, comprising:
   a tape carrier body having a mounting portion on which a semiconductor integrated circuit is mounted and a test pad array which includes a plurality of signal test pads, at least one nonconnected dummy test pad, and a power supply test pad situated at an outermost end of the test pad array, said at least one dummy test pad being located between the power supply test and the plurality of signal test pads, the test pad array being spaced from said mounting portion and being connected to said semiconductor integrated circuit, said semiconductor integrated circuit being provided with a power supply pad to which a supply voltage is applied and a plurality of signal pads for inputting and outputting signals, the number of said test pads of said test pad array being larger than the total number of said power supply pad and said signal pads of said semiconductor integrated circuit;
   first leads having first ends connected to said signal pads of said semiconductor integrated circuit and second ends connected to said test pads of said tape carrier body; and
   a second lead having a first end connected to said power supply pad of said semiconductor integrated circuit, and a second end connected to said power supply test pad.

2. A tape carrier according to claim 1, in which said second end of said second lead is connected to a plurality of test pads which are disposed close to one another.

3. A tape carrier according to claim 1, in which said second end of said second lead is wider than said first end thereof.

4. A tape carrier according to claim 1, in which said mounting portion is formed on said tape carrier body through slits and tie bars, and said second lead is disposed on a tie bar.

5. A tape carrier, comprising:
   a tape carrier body having a mounting portion which is formed in the center of said tape carrier body by slits and tie bars and on which a semiconductor integrated circuit is mounted and also having a test pad array which includes a plurality of signal test pads, at least one power supply test pad, and at least one non-connected dummy pad disposed therebetween, the test pad array being spaced from said mounting portion and being connected to said semiconductor integrated circuit, said semiconductor integrated circuit being provided with a power supply pad for receiving a test supply voltage, and a plurality of signal pads for inputting and outputting signals, the number of said test pads of said tape carrier body being larger than the total number of said power supply pad and said signal pads of said semiconductor integrated circuit;
   first leads having first ends connected to said signal pads of said semiconductor integrated circuit and second ends connected to said test pads of said tape carrier body; and a second lead having a first end connected to said power supply pad of said semiconductor integrated circuit and a second end connected to the power supply test pad, said second lead being disposed on one of said tie bars.

6. A tape carrier, comprising:

a tape carrier body having a mounting portion and a test pad array including a group of signal test pads, at least one non-connected test pad dummy, and a power supply test pad, said at least one non-connected test pad being located between said group of signal test pads and said power supply test pad, and said power supply test pad being located at an outermost end of the test pad array;

a semiconductor integrated circuit located on said mounting portion of said tape carrier body, said integrated circuit having a plurality of circuit pads including a power supply circuit pad and a group of signal circuit pads;

first leads having first ends connected to said signal circuit pads, and second ends connected to said signal test pads; and a second lead having a first end connected to said power supply circuit pad and a second end connected to said power supply test pad.

7. A tape carrier as set forth in claim 6 wherein the test pads of the test pad array are uniformly spaced form each other at a predetermined interval.

8. A tape carrier, comprising:

a tape carrier body having a mounting portion and a test pad array including a group of signal test pads, at least one non-connected test pad dummy, and a test pad being located at an outermost end of the test pad array, said at least one non-connected dummy test pad being located between said group of signal test pads and said outermost test pad;

a semiconductor integrated circuit located on said mounting portion of said tape carrier body, said integrated circuit having a plurality of circuit pads; and a plurality of leads having first and second ends, said first ends being connected to said circuit pads, a second end of one of the plurality of leads being connected to said outermost test pad, and the other of said second ends being connected to said group of signal test pads.

9. A tape carrier, comprising:

a tape carrier body having a mounting portion a test pad array including a group of signal test pads, and a group of power supply test pads, and at least one non-connected dummy test pad located in the test pad array, said group of power supply test pads being disposed adjacent each other at an outermost end of the test pad array;

a semiconductor integrated circuit located on said mounting portion of said tape carrier body, said integrated circuit having a plurality of circuit pads including a power supply circuit pad and a group of signal circuit pads;

first leas having first ends connected to said signal circuit pads, and second ends connected to said signal test pads; and a second lead having a first end connected to said power supply circuit pad and a second end connected to each of said plurality of power supply test pads.

10. A tape carrier as set forth in claim 9 wherein a portion of the second end of the second lead has a width greater than a width of the first end thereof.

* * * * *

UNITED STATES PATENT AND TRADEMARK OFFICE
CERTIFICATE OF CORRECTION

PATENT NO. : 5,157,476
DATED : October 20, 1992
INVENTOR(S) : Akito Yoshida

It is certified that error appears in the above-identified patent and that said Letters Patent is hereby corrected as shown below:

Claim 1, column 4, line 14, change "noncon-" to --non-con--.

Claim 5, column 4, line 56, after "dummy" insert --test--.

Claim 6, column 5, line 11, before "test pad" insert dummy-- and after "test pad" delete --dummy--.

Claim 6, column 5, line 13, before "test pad" insert dummy--.

Claim 7, column 5, line 29, change "form" to --from--.

Claim 8, column 5, line 34, before "test pad" insert --dummy-- and after "test pad" delete --dummy--.

Claim 9, column 6, line 13, change "carrie , to --carrier,--.

UNITED STATES PATENT AND TRADEMARK OFFICE
CERTIFICATE OF CORRECTION

PATENT NO. : 5,157,476

DATED : October 20, 1992

INVENTOR(S) : Akito Yoshida

It is certified that error appears in the above-identified patent and that said Letters Patent is hereby corrected as shown below:

Claim 9, column 6, line 14, after "portion" insert --and--.

Claim 9, column 6, line 15, after "pads," delete --and--.

Claim 9, column 6, line 26, change "leas" to --leads--.

Signed and Sealed this

Fifteenth Day of February, 1994

Attest:

BRUCE LEHMAN

Attesting Officer     Commissioner of Patents and Trademarks